(12) United States Patent
Sugimoto et al.

(10) Patent No.: US 9,196,399 B2
(45) Date of Patent: Nov. 24, 2015

(54) COMPOSITE SUPERCONDUCTOR, AND METHOD FOR PRODUCING COMPOSITE SUPERCONDUCTOR

(75) Inventors: Masahiro Sugimoto, Tokyo (JP); Hirokazu Tsubouchi, Tokyo (JP); Hitoshi Shimizu, Tokyo (JP); Toshiya Okada, Tokyo (JP); Toshirou Sakai, Tokyo (JP); Kazuya Takahata, Gifu (JP); Hitoshi Tamura, Gifu (JP); Toshiyuki Mito, Gifu (JP)

(73) Assignees: FURUKAWA ELECTRIC CO., LTD., Tokyo (JP); UACJ CORPORATION, Tokyo (JP); INTER-UNIVERSITY RESEARCH INSTITUTE CORPORATION NATIONAL INSTITUTES OF NATURAL SCIENCES, Tokyo (JP)

( * ) Notice: Subject to any disclaimer, the term of this patent is extended or adjusted under 35 U.S.C. 154(b) by 0 days.

(21) Appl. No.: 14/343,020

(22) PCT Filed: Sep. 4, 2012

(86) PCT No.: PCT/JP2012/072504
§ 371 (c)(1),
(2), (4) Date: Jun. 5, 2014

(87) PCT Pub. No.: WO2013/035707
PCT Pub. Date: Mar. 14, 2013

(65) Prior Publication Data
US 2014/0274726 A1    Sep. 18, 2014

(30) Foreign Application Priority Data
Sep. 6, 2011  (JP) .................. 2011-194403

(51) Int. Cl.
*H01L 39/14*  (2006.01)
*H01B 12/10*  (2006.01)
*H01B 13/00*  (2006.01)
*H01L 39/24*  (2006.01)

(52) U.S. Cl.
CPC ............... *H01B 12/10* (2013.01); *H01B 13/00* (2013.01); *H01L 39/14* (2013.01); *H01L 39/2403* (2013.01); *H01L 39/2409* (2013.01); *Y10T 29/49014* (2015.01)

(58) Field of Classification Search
CPC ..... H01L 39/143; H01L 39/248; H01L 39/14; H01B 12/06
See application file for complete search history.

(56) References Cited

U.S. PATENT DOCUMENTS

| 4,490,578 A | 12/1984 | Suzuki et al. |
| 2010/0222222 A1 | 9/2010 | Mito et al. |

FOREIGN PATENT DOCUMENTS

| EP | 0500101 A1 | 8/1992 |
| JP | H5-109325 | * 4/1993 |

(Continued)

OTHER PUBLICATIONS

Translation JP05-109325, pp. 1-4.*

(Continued)

*Primary Examiner* — Colleen Dunn
(74) *Attorney, Agent, or Firm* — Amin, Turocy & Watson, LLP

(57) ABSTRACT

A method for producing a composite superconductor includes: a structure forming process of forming a structure including a metal covering member (20) including at least one to-be-joined portion, a superconductor (30) arranged inside the metal covering member, and a reinforcing member (40) arranged between the superconductor (30) and the at least one to-be-joined portion; and a joining process of joining thereafter the at least one to-be-joined portion.

13 Claims, 14 Drawing Sheets

(56) References Cited

FOREIGN PATENT DOCUMENTS

| | | | |
|---|---|---|---|
| JP | H5-109325 A | | 4/1993 |
| JP | H5-205544 | * | 8/1993 |
| JP | H5-205544 A | | 8/1993 |
| JP | H8-298033 | * | 11/1996 |
| JP | H8-298033 A | | 11/1996 |
| JP | H9-069318 | * | 3/1997 |
| JP | H9-069318 A | | 3/1997 |
| JP | 2000-164053 A | | 6/2000 |
| JP | 2001-267120 A | | 9/2001 |
| JP | 2007-214121 | * | 8/2007 |
| JP | 2007-214121 A | | 8/2007 |

OTHER PUBLICATIONS

Translation JP08-298033, pp. 1-4.*
Translation JP05-050554, pp. 1-6.*
Translation JP09-069318, pp. 1-5.*
Toshinari Ando, "Nb3Sn Conductor Development for Fusion Power Applications", J. Cryo. Soc. Jpn., vol. 39, No. 9, 2004, pp. 383-390.
International Search Report mailed Oct. 23, 2012 for PCT Application Serial No. PCT/JP2012/072504, 2 pages.
Extended European Search Report dated May 6, 2015 for European Application No. 12829727.2, 6 pages.

* cited by examiner

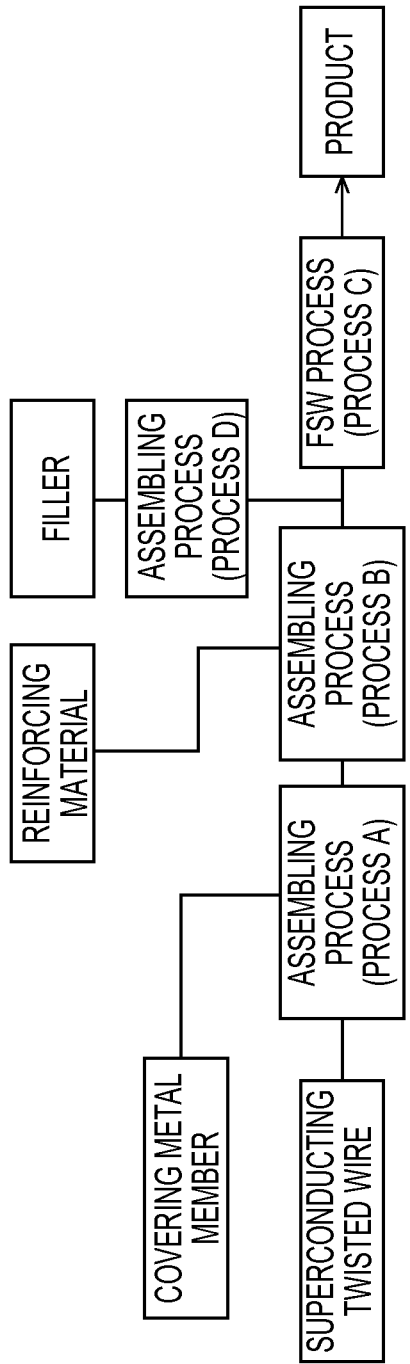

COMPOSITE SUPERCONDUCTOR, AND METHOD FOR PRODUCING COMPOSITE SUPERCONDUCTOR

CROSS-REFERENCE TO RELATED APPLICATIONS

This application is a U.S. National Stage application of, and claims priority to, PCT Patent Application No. PCT/JP2012/072504, filed Sep. 4, 2012 and entitled "COMPOSITE SUPERCONDUCTOR, AND METHOD FOR PRODUCING COMPOSITE SUPERCONDUCTOR"; which claims priority to Japanese Patent Application No. 2011-194403, filed Sep. 6, 2011. The entireties of the above-referenced applications are incorporated herein by reference.

TECHNICAL FIELD

The present invention relates to a composite superconductor and a method for producing a composite superconductor.

BACKGROUND ART

In general, a superconductor is used while being cooled in a forced method or an indirect method by immersing it in a refrigerant such as liquid helium or combining it with a refrigerator or the like to maintain its superconductivity. Specifically, a composite superconductor in which aluminum and a superconductor composed of an alloy superconductive material such as NbTi are combined so as to take advantage of high specific heat, high thermal conductivity, adjustable electric conductivity, small specific gravity, low radioactivity and the like of aluminum is put into practical use (see, for example, Japanese Patent Application Laid-Open (JP-A) No. 2000-164053).

Further, JP-A 2001-267120 introduces application of joining by friction stir welding (FSW) in order to produce a superconducting coil by joining aluminum covering conductors combined with the alloy superconductive material.

Further, JP-A 2007-214121 discloses a high performance composite superconductor comprising, as a superconductor, a compound superconductive material or the like having excellent superconducting characteristics such as critical current density, critical magnetic field, and critical temperature, wherein the thermal, mechanical, and electrical contact conditions between the superconductor and the metal member such as aluminum are controlled.

In general, a compound superconductor is produced by subjecting a raw material to a generation treatment such as a heat treatment, and is vulnerable to mechanical strain. Therefore, when using a production method such as coating extrusion or composite wire drawing which has been applied to a superconductor of alloy superconductive material, the critical current characteristic is partially decreased due to application of plastic working, which is problematic. In order to solve this problem, friction stir welding (FSW) is applied as a joining method for combining a compound superconductor and aluminum. Although, conventionally, there is a method in which an $Nb_3Sn$ superconductor is arranged at a hollow portion formed by a metal member obtained by combining two copper members and a joint portion of the copper members is soldered (for example, see *Cryogenic engineering* 39, vol. 9, 2004, pages 383 to 390, ANDO Toshinari), it was difficult to change the metal member to aluminum. However, by applying FSW, it becomes possible to use, as a metal member, an aluminum member in place of the copper member. Since aluminum has a large thermal conductivity and a high specific heat, and the surface thereof is easily to be oxidized, it is necessary to rapidly apply a large amount of heat in a state in which the oxide film on the surface thereof is removed when soldering is carried out. However, by applying FSW, application of a large amount of heat can be avoided.

JP-A H09-069318 discloses a method in which an NbTi superconductor and a stabilizer are accommodated in a hollow portion formed by combining two strengthening members, and the strength members are welded with each other by arc welding or beam welding.

However, since, in a conventional method such as soldering, brazing, arc welding (TIG welding or MIG welding) or beam welding, adjustment of the quantity of heat to be applied to a metal member during welding is difficult, there has been a risk of decrease in dimensional accuracy of the joint portion, or deformation or alteration in quality of a superconductor due to heat during welding. Since, in FSW, welding is performed not by fusion joining but by solid phase joining, the above-mentioned problems in conventional art are expected to be overcome.

DISCLOSURE OF INVENTION

By carrying out additional studies for confirming the results of JP-A 2007-214121, it has become clear that, depending on the structural design of a composite conductor or the strength of a metal covering member to be used, in some cases, a joint portion of the metal covering member is buckled, and at the same time, a compound superconductor inside the metal covering member is mechanically damaged, thereby decreasing the current-carrying performance of the composite conductor. This not only results in a high risk of the occurrence of failure particularly when applied to a long composite superconductor, but may adversely affect the mass production yield rate even when applied to a short composite superconductor. Further, since the temperature of the filler is not controlled in a combining process in which a metal filler is arranged at a gap portion between the metal covering member and the superconductor, the filler may be solidified or liquefied. For this reason, the filler is unevenly arranged at the gap portion between the metal covering member and the superconductor, or a solidified filler presses the superconductor, thereby damaging the superconductor, which has been problematic. A conventional art also has a problem that, when a compound superconductor having a high strain sensitivity is employed as a superconductor, the current-carrying characteristic of the superconductor is decreased due to cooling strain.

The invention has been made in view of the above-mentioned facts, and an object thereof is to provide a composite superconductor of a superconductor and a metal covering member in which the effect of a stress applied to a joint portion of a metal covering member surrounding the outer periphery of the superconductor can be mitigated, and to provide a method for producing a composite superconductor of a superconductor and a metal covering member in which a damage to the superconductor due to joining of a joint portion of the metal covering member surrounding the outer periphery of the superconductor can be mitigated.

A method for producing a composite superconductor pertaining to a first aspect of the invention comprises:

a structure forming process of forming a structure including a metal covering member including at least one to-be-joined portion, a superconductor arranged inside the metal covering member, and a reinforcing member arranged between the superconductor and the at least one to-be-joined portion; and a joining process of joining thereafter the at least one to-be-joined portion.

By this configuration, a damage to a superconductor due to joining can be mitigated.

A method for producing a composite superconductor pertaining to a second aspect of the invention is the method according to the first aspect, wherein the structure forming process is a process of forming the structure such that the reinforcing member is positioned on a line extended from the to-be-joined portion in a direction in which a stress is applied in the joining process, and such that the superconductor is positioned between the reinforcing members.

A method for producing a composite superconductor pertaining to a third aspect of the invention is the method according to the first aspect, wherein the structure forming process is a process of forming the structure such that the reinforcing member and the superconductor exist on a line extended from the to-be-joined portion in a direction in which a stress is applied in the joining process, and such that both end portions of the reinforcing member are positioned at reinforcing member fixing sections formed on the metal covering member.

A method for producing a composite superconductor pertaining to a fourth aspect of the invention is the method according to any one of the first to third aspects, wherein the structure forming process is a process of forming a structure including the metal covering member including at least one to-be-joined portion, the superconductor arranged inside the metal covering member, the reinforcing member arranged between the superconductor and the at least one to-be-joined portion, and a filler arranged inside the metal covering member, and the method further comprises, after the joining process, a process of heating the structure in which the joining has been performed and applying pressure to the metal covering member from outside.

By this configuration, unevenness of the filler after filling can be reduced, and by reducing gap in the composite superconductor, the volume of the composite superconductor per se can be reduced.

A method for producing a composite superconductor pertaining to a fifth aspect of the invention is the method according to the fourth aspect, wherein a releasing hole for releasing at least one of a surplus of the filler or a gas inside the metal covering member is formed in the metal covering member.

By this configuration, a surplus filler or air can be released, thereby improving the filling rate.

A method for producing a composite superconductor pertaining to a sixth aspect of the invention is the method according to any one of the first to fifth aspects, wherein the joining of the at least one to-be-joined portion is performed by a friction stir welding (FSW) method.

The friction stir welding (FSW) method is a method in which a joining tool provided with a protruded pin on the end thereof is pressed against a joint portion while being rotated at a predetermined rotation speed, and the material of the joint portion is softened due to the frictional heat generated thereby to cause a plastic flow, whereby joining is performed by utilizing a plastic flow phenomenon in a solid state while the material of the joint portion is not heated to a melting point thereof. As mentioned above, since joining by the friction stir welding (FSW) method is not fusion joining but solid phase joining, a composite superconductor in which the thermal, mechanical, and electrical contact conditions between a superconductor and a metal covering member are controlled can be obtained. In addition, aluminum can be used for a metal covering member. In addition, adjustment of the quantity of heat applied to the metal covering member during joining is facilitated, the dimensional accuracy of the joint portion is improved, and deformation of a superconductor or alteration in quality of a superconductor due to heat during joining can be inhibited.

A method for producing a composite superconductor pertaining to a seventh aspect of the invention is the method according to the sixth aspect, wherein the metal covering member is pure aluminum or an aluminum alloy, and the superconductor is a compound superconductor.

By this configuration, adjustment of the quantity of heat applied to the metal covering member during joining is facilitated since joining by the friction stir welding (FSW) method is not fusion joining but solid phase joining. As a result, a mechanically weak compound superconductor and a metal covering member composed of pure aluminum or aluminum alloy can be effectively combined.

A method for producing a composite superconductor pertaining to an eighth aspect of the invention is the method according to the seventh aspect, wherein the joining process is performed in a state in which tensile strain is applied to the superconductor.

This configuration is effective in a case of a superconductor (compound superconductor) having a strain characteristic, and combining can be performed while releasing the strain, thereby inhibiting deterioration in performance due to cooling strain.

A method for producing a composite superconductor pertaining to a ninth aspect of the invention is the method according to any one of the first to eighth aspects, wherein the superconductor is a superconducting molded twisted wire that has been obtained by twisting and molding surface-plated superconducting element wires, and a plating on a surface of the superconducting molded twisted wire has been partially removed.

By this configuration, the surface of the superconductor becomes rough, and sliding with the metal covering member can be inhibited. By reducing the sliding between the superconductor and the metal covering member, the contact condition between the superconductor and the metal covering member can be excellent.

A method for producing a composite superconductor pertaining to a tenth aspect of the invention is the method according to any one of the second to ninth aspects, wherein an inner surface of the metal covering member has been plated, and the superconductor is in contact with the metal covering member via a plated portion.

By this configuration, joining properties between the metal covering member and the filler can be improved.

A composite superconductor pertaining to an eleventh aspect of the invention comprises:

a superconductor;

a metal covering member which surrounds an outer periphery of the superconductor and has at least one joint portion; and a reinforcing member arranged between the joint portion and the superconductor.

By this configuration, since a reinforcing member is arranged between a joint portion and a superconductor, the influence of a stress applied to the joint portion can be mitigated, and there is an effect of enduring the stress.

A composite superconductor pertaining to a twelfth aspect of the invention is the composite superconductor according to the eleventh aspect, wherein the reinforcing member has a 0.2% proof stress that is larger than that of the metal covering member.

A composite superconductor pertaining to a thirteenth aspect of the invention is the composite superconductor according to the eleventh or twelfth aspect of the invention, wherein a reinforcing member fixing section for fixing the reinforcing member is formed on the metal covering member, and the reinforcing member is fixed on the reinforcing member fixing section.

By this configuration, accuracy can be increased. For example, the reinforcing member can be fixed, movement of the reinforcing member toward the superconductor side can be inhibited, and the composite superconductor can be assembled without damaging the superconductor.

A composite superconductor pertaining to a fourteenth aspect of the invention is the composite superconductor according to any one of the eleventh to thirteenth aspects of the invention, wherein a filler exists between the metal covering member and the superconductor.

In this configuration, the filler effectively makes a contribution for decreasing the gap which is increased by incorporating a reinforcing member.

A composite superconductor pertaining to a fifteenth aspect of the invention is the composite superconductor according to any one of the eleventh to fourteenth aspects, wherein the superconductor is a superconducting molded twisted wire formed by twisting a plurality of superconducting wires.

A composite superconductor pertaining to a sixteenth aspect of the invention is the composite superconductor according to the fifteenth aspect of the invention, wherein the superconducting wire is a compression-molded superconducting wire obtained by compression-molding a plurality of superconducting element wires arranged on an outer periphery of a core wire.

BRIEF DESCRIPTION OF DRAWINGS

FIG. 3 illustrates a production process of a composite superconductor pertaining to Example 2 of the invention.

PREFERRED MODE FOR CARRYING OUT THE INVENTION

Figure 1A:
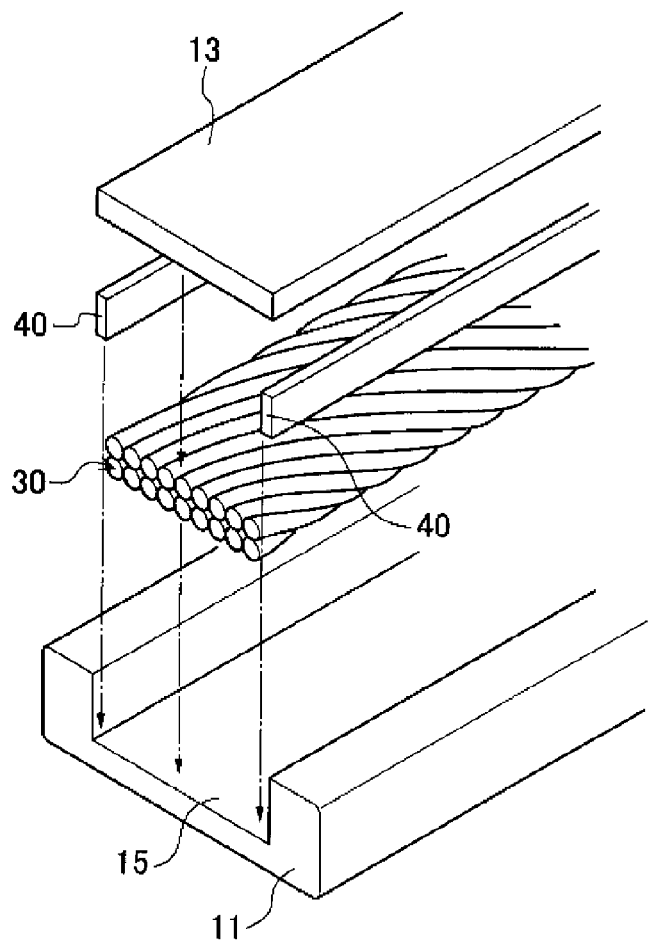
FIG. 1A illustrates a production process of a composite superconductor pertaining to Example 1 of the invention.
Figure 1B:
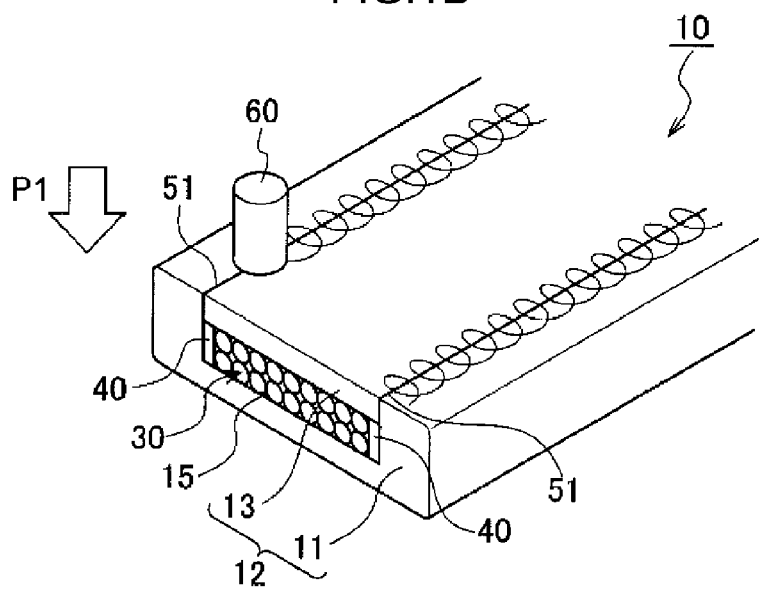
FIG. 1B illustrates a production process of a composite superconductor pertaining to Example 1 of the invention.
Figure 2:
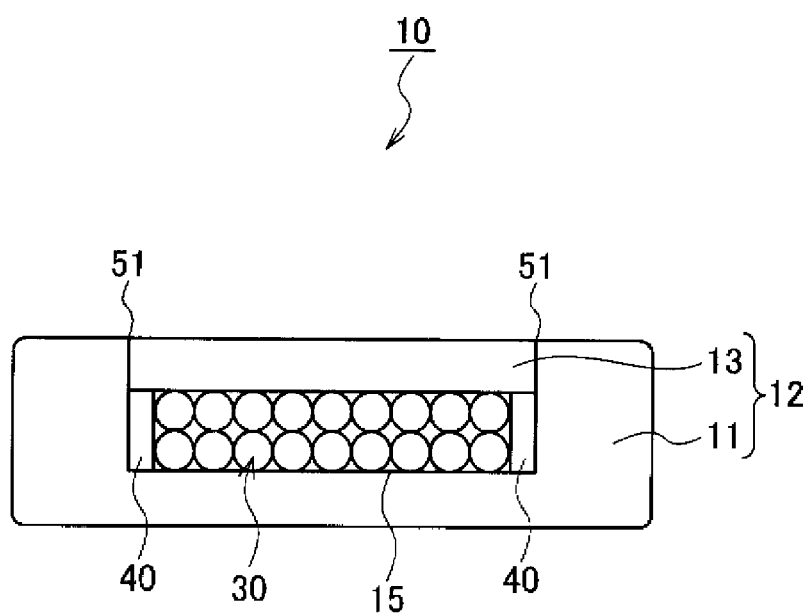
FIG. 2 illustrates a cross-section structure of a composite superconductor pertaining to Example 1 of the invention.

An embodiment of the invention relates to a composite superconductor in which a superconductor and a metal covering member such as aluminum are combined, which is applicable not only to a superconductor configured by an alloy superconductive material (NbTi or the like) but also to a superconductor configured by a compound superconductive material ($Nb_3Sn$, $Nb_3Al$, Bi superconductive material, Y superconductive material, $MgB_2$ superconductive material) which is vulnerable to mechanical strain. In particular, a composite superconductor whose current-carrying characteristic hardly falls below the current-carrying characteristic thereof before combining is provided.

In a stepped fitting method using a rectangle cross-section grooved member and a fitting member or in a no-step fitting method only using butting members in a conventional art disclosed in JP-A 2007-214121, joint portion is buckled during FSW joining and an inside superconductor is damaged in some cases. However, according to an embodiment of the invention, by arranging (backing) a reinforcing member composed of a material having a higher strength than the material at a portion where joining is performed immediately below (inside) a joint portion and preventing buckling of the member during FSW, no damage is applied to the superconductor or a damage to the superconductor can be inhibited.

According to an embodiment of the invention, an aluminum member having an open portion, a superconductor, and a filler are combined at a temperature less than the melting temperature of a metal filler, and then, the open portion of the aluminum member is joined by FSW. The aluminum member having the open portion, the filler, and the superconductor are combined in a state in which the superconductor is not compressed, the open portion of the aluminum member is joined by FSW to obtain an aluminum composite conductor, and then, a heat compression is performed in a state in which the temperature is maintained not lower than the melting point of the filler in order for the inside filler to fill a gap portion formed between the aluminum composite material and the superconductor. By providing the aluminum composite member with a releasing hole for releasing a surplus filler or air, smooth filling is facilitated. According to an embodiment of the invention, due to such effects, the filler enters a gap between the aluminum composite material and the superconductor to render a gap portion smaller than 10%, and therefore, the (electrical and mechanical) contact condition of the aluminum composite member and the superconductor is excellent, thereby obtaining a practical aluminum composite superconductor.

According to an embodiment of the invention, assembling is performed in a state in which a tensile strain of 0.4% or smaller is applied to the superconducting element wire by pulling a superconductor formed by twisting superconducting element wires in a longitudinal direction, the aluminum composite member is joined in a state in which the tensile strain is applied to the superconducting element wire, and heat compression is further performed in such a condition. When a tensile strain larger than 0.4% is applied, the compound superconductor is damaged, and the performance is likely to decrease, which is not preferred.

By this, performance decrease due to cooling strain of the superconducting element wire can be inhibited. When the tensile strain is 0% or smaller (compression strain), an effect of inhibiting decrease in the performance due to cooling strain is not obtained. By allowing the superconducting element wire to experience 0.1% to 1% bending strain in place of tensile strain, a similar effect can be obtained. Since, in this production method, production is performed via a process in which a superconductor, an aluminum member, and a filler having a temperature less than the melting point are continuously provided and assembled, a process in which an aluminum open portion is joined by FSW in a state in which there are a superconductor, a filler, and a gap portion inside the aluminum member, and a process in which compression is performed at a temperature not lower than the melting point of the filler to render the gap portion smaller than 10%, it becomes possible to stably produce a practical long-length composite superconductor or to mass-produce the same.

In the following, a method for producing a superconducting wire material pertaining to an embodiment of the invention is specifically described with reference to the attached Drawings. In the Drawings, members (components) having the same or corresponding functions are indicated with the same numerals and the explanation thereof is omitted as appropriate.

In the following, among embodiments of the invention, a best mode of a composite superconductor is described by way of examples.

Figure 4A:
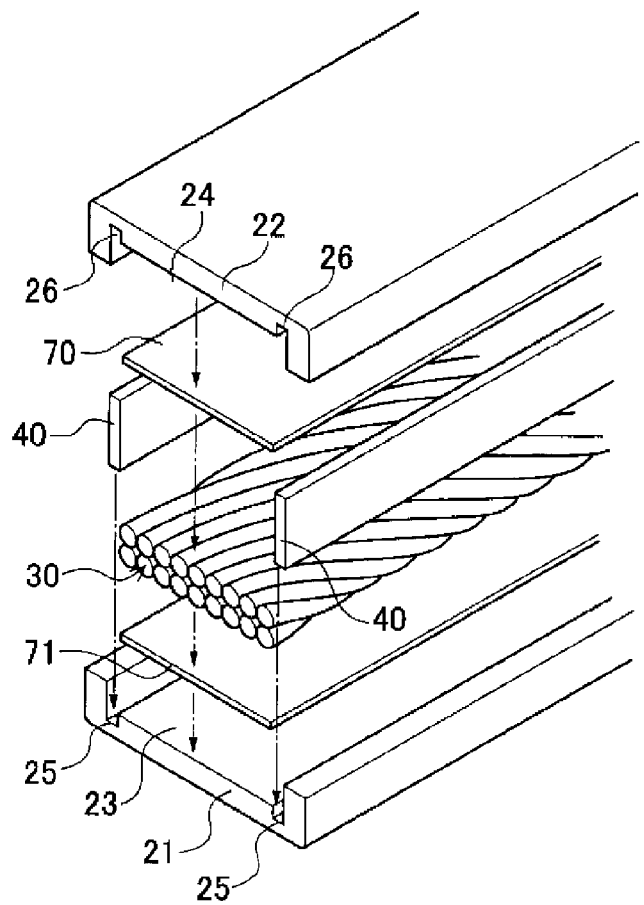
FIG. 4A illustrates a production process of a composite superconductor pertaining to Example 2 of the invention.
Figure 4B:
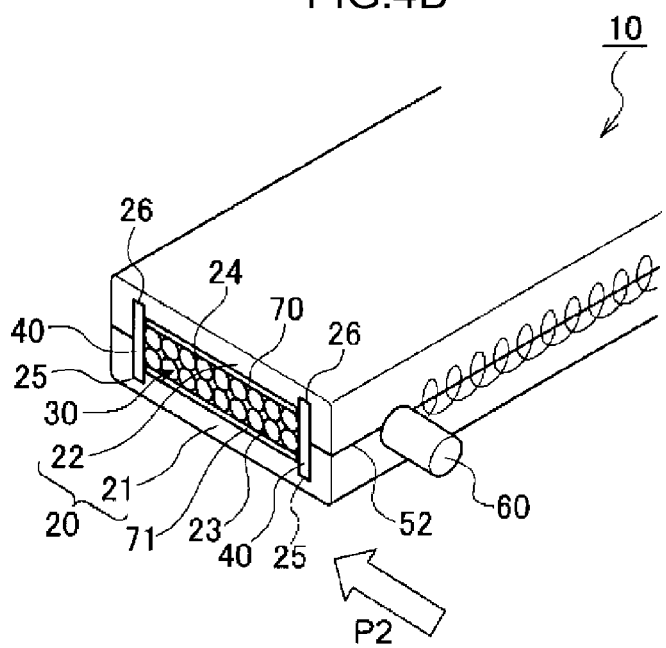
FIG. 4B illustrates a production process of a composite superconductor pertaining to Example 2 of the invention.

First, as illustrated in FIG. 4A, in a major groove 23 of a grooved member 21 composed of an aluminum alloy having a rectangle cross-section, a superconducting twisted wire (superconductor) 30 is arranged which is prepared by twisting a plurality of Cr plated un-reacted $Nb_3Sn$ superconducting wires, molding it into a rectangular shape, removing plating on a part of the surface of the molded twisted wire by rubbing with a file, and then performing an $Nb_3Sn$ generation heat treatment. Next, one end portion of a reinforcing member 40 made of SUS304 is arranged on each of both sides of the superconductor 30 and on a minor groove 25 of the grooved member 21 made of an aluminum alloy. Next, tape shaped fillers 70, 71 are arranged such that they are in contact with the superconductor 30, and then, a major groove 24 of a grooved member 22 made of an aluminum alloy is fitted, and the other end portion of the reinforcing member 40 is arranged on a minor groove 26 of the grooved member 22. As illustrated in FIG. 4B, a joining tool 60 provided with a pin (not illustrated) on the tip is pressed against seams 52 which emerge on both sides of the metal covering member 20 composed of the grooved member 21 and the grooved member 22 while being rotated at a predetermined rotation speed, whereby joining was performed by FSW. In other words, as illustrated in processes in FIG. 10, a process (A) in which the superconductor 30 is arranged inside the metal covering member 20 comprising a joint portion (grooved member 21 and grooved member 22), a process (B) in which the reinforcing member 40 is arranged between the joint portion and the superconductor 30, and an FSW process (process (C)) were performed.

Figure 10:
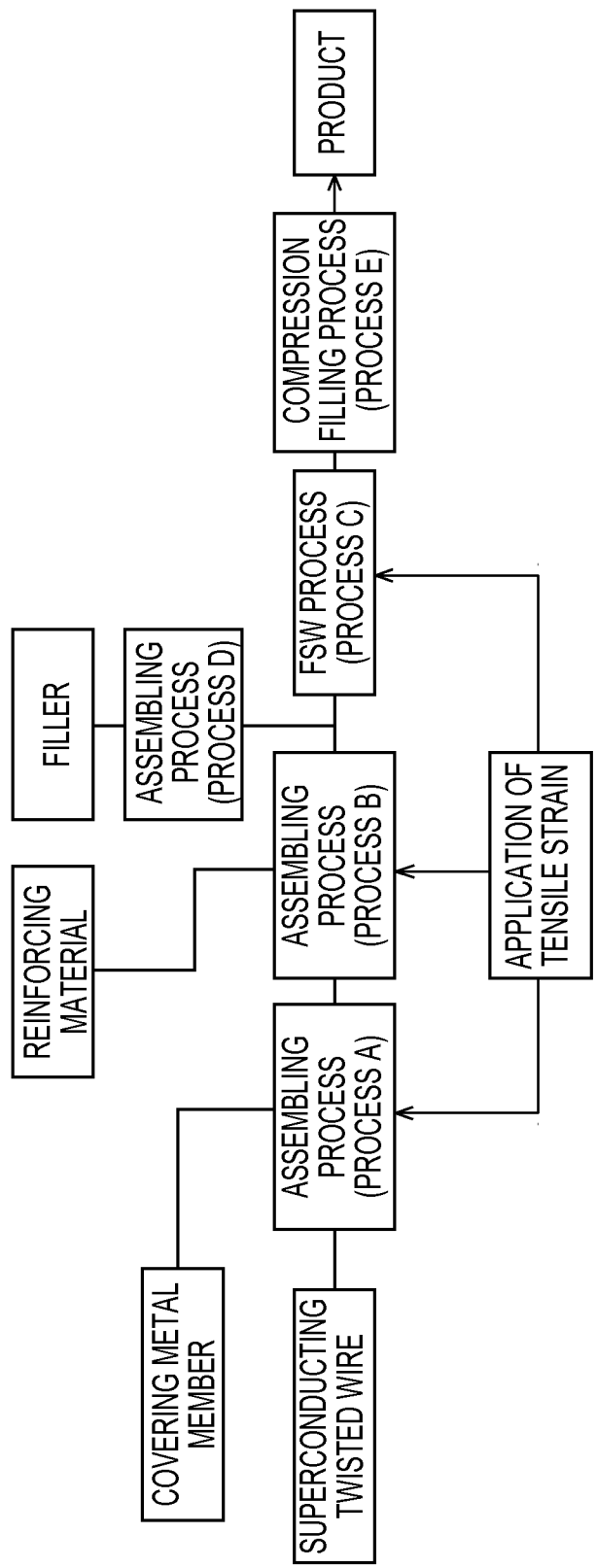
FIG. 10 illustrates a production process of a composite superconductor pertaining to Example 4 of the invention.

During these processes, as illustrated in the processes in FIG. 10, the process (A) in which the superconductor 30 is arranged inside the metal covering member 20, the process (B) in which the reinforcing member 40 is arranged between the joint portion and the superconductor 30, and the process (C) in which the metal covering member 20 is joined by FSW such that the joint portion between metal covering members (the grooved member 21 and the grooved member 22) is in contact with the reinforcing member 40 were performed in a state in which a tensile strain in a range of 0.4% or smaller is applied to the superconductor 30.

Figure 5:
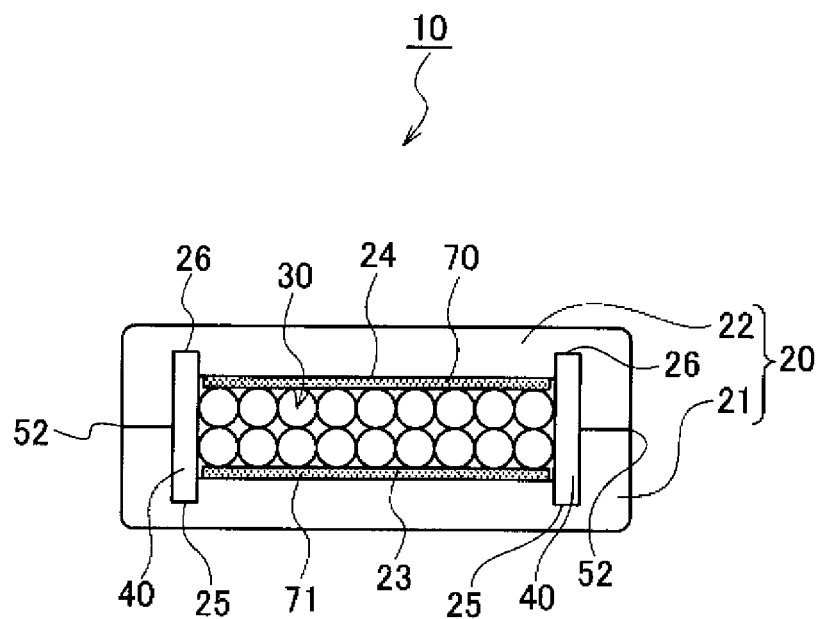
FIG. 5 illustrates a cross-section structure of a composite superconductor pertaining to Example 2 of the invention.

By performing a process (D) in which fillers 70, 71 are arranged inside the metal covering member 20 prior to the above-mentioned process (C), and performing a process (E) in which the fillers 70, 71 are filled between the superconductor 30 and the metal covering member 20 by heat compression after the process (C), a composite superconductor 10 illustrated in FIG. 4A, FIG. 4B, and FIG. 5 was produced.

Although the above is an example of a best mode of a composite superconductor among embodiments of the invention, an embodiment of the invention is not limited thereto, and the following modes can be applied.

Although, in the above best mode, a superconducting molded twisted wire obtained by twisting 18 $Nb_3Sn$ superconducting element wires was used for the superconductor 30, the superconductor 30 is not limited thereto, and for the purpose of increasing the capacity, a superconducting molded twisted wire formed by twisting and compression-molding arbitrary number of compression-molded superconducting wires formed by compression-molding a plurality of superconducting element wires arranged on the outer periphery of a core wire may be used. By using the compression-molded superconducting wire, the space factor of the superconducting element wire in the composite superconductor 10 can be further improved, and the space factor of the fillers 70, 71 can be further decreased.

By this, the current density of the composite superconductor 10 is increased, and the movement of a superconducting element wire in the superconductor 30 which configures the composite superconductor 10 is inhibited, whereby the current-carrying stability of the composite superconductor 10 is improved. Since the amount of a filler in the composite superconductor 10 can be reduced, the composite superconductor 10 having an excellent production stability in the longitudinal direction of the composite superconductor 10 during joining or the like can be obtained.

When a compression-molded superconducting wire is applied to the superconductor 30, copper, copper alloy, stainless steel or the like can be used as a core wire of the compression-molded superconducting wire.

In particular, in cases where the superconductor 30 is a superconducting molded twisted wire having a high compression rate, the strength of a core wire in the radial direction is desirably lower than the strength of the superconducting element wire in the radial direction. For example, a copper wire made of oxygen-free copper, a CuNb alloy composite wire whose surface is oxygen-free copper, or a CuNi alloy composite wire whose surface is oxygen-free copper is suitably used for the core wire. By using a core wire having a lower strength than a superconducting element wire, the core wire selectively deforms during molding, and a damage to the superconducting element wire can be minimized. In such cases, by making the core wire in a twisted wire structure, a core wire is likely to be selectively deformed during molding.

On the other hand, in a production process or a winding process of superconducting molded twisted wire, in cases where a large stress due to bending strain or tensile strain is applied to a superconducting molded twisted wire, the strength of the core wire is desirably higher than that of a superconducting element wire. For example, a core wire composed of CuNb alloy or stainless steel is suitably used. By using a core wire having a higher strength than that of a superconducting element wire, the core wire functions as a strength member against an applied large stress, and a damage to the superconducting element wire can be minimized in a production process or a winding process of superconducting molded twisted wire. This effect can be obtained also when a superconducting molded twisted wire which has been subjected to an $Nb_3Sn$ generation heat treatment is applied.

As another mode for the purpose of obtaining large capacity, a transposed conductor which is obtained by assembling and transposing an odd number of rectangular molded superconducting twisted wires composed of arbitrary number of wires may also be used.

Here, although an inner surface of the grooved members 21 and 22 which are a metal covering member facing the superconductor 30 is not subjected to plating, Ni plating, Sn plating, or the like is desired since the joining properties are improved depending on the material of the filler. In cases when $Nb_3Sn$ element wire is used, plating to which a superconducting element wire is subjected is generally Cr plating, but the material of plating is not limited thereto.

As a compound superconducting wire such as an $Nb_3Sn$ superconducting wire, a wire rod having a high strength that is combined with a strengthening material such as a CuNb alloy can also be used. A filler having a shape of a tape may be inserted, or the rectangular molded superconducting twisted wire may be impregnated in advance with a filler such as a solder. Since the fillers 70, 71 are used for the purpose of improving the contact conditions (mechanical, thermal, and electrical) between the superconductor 30 and the metal covering member 20, they are desirably metal having a low melting point which melts at a temperature at which the performance of the superconductor 30 is not decreased and the strength of the metal covering member 20 is not decreased.

The metal covering member 20 to be joined is not necessarily the same type of aluminum alloy, and aluminum alloys having different strength, or different types of metal members such as copper and an aluminum alloy may be used.

In the best mode mentioned above, the reinforcing member 40 was SUS304, but it is not necessarily SUS304. As long as it has a 0.2% proof stress larger than that of the metal covering member 20, it may be a Cu alloy or a similar type of aluminum alloy with a different thermal refining than that of a grooved member. For example, even when the same type of aluminum alloy metal is used, a strength difference of 20 percent or higher can be obtained by the difference in the thermal refining (for example, 6061-T4 treatment and T6 treatment). The strength or shape of the reinforcing member 40 is desirably selected depending on the application of the composite superconductor 10. In the case of joining by FSW, change in the strength of a joint portion by FSW, or the strength distribution of the whole composite superconductor 10 after combining is desirably taken into consideration. By appropriately selecting the strength or shape of the reinforcing member 40, the winding properties when the composite superconductor 10 is coiled or the mechanical stability during current-carrying can be improved.

A heat compression method is described below. A method using frictional heating in FIG. 6A, FIG. 6B, a method using a heat compression roller 84 illustrated in FIG. 11A, or a method using a heated die for compression 85 illustrated in FIG. 11B can be applied, and a method of a combination thereof can also be applied. As for the FSW joint portion, an example of joining a composite member at two symmetrical positions is exemplified above. However, asymmetrical positions can be used depending on the demand characteristics of the product.

On the other hand, the formation of roughness on the outer periphery of the superconductor 30, or the formation of roughness on a surface of the metal covering member 12 or 20 at the side at which the superconductor 30 is contained is desired since the contact condition (mechanical, thermal, electrical) between the superconductor 30 and the metal covering member 12 or 20 is improved.

Further, depending on the amount of compression in a compression filling process, it is desired that the amount of filler 70, 71 is adjusted, and that a space for inserting fillers 70, 71 is provided in the metal covering member 20. For suitable compression, a starting portion which is to be a trigger of deformation is desirably provided in advance in the metal covering member 20.

It is noted that, in the present embodiment, the fillers 70, 71 are arranged inside the metal covering member 20 prior to the joining process (process C), but not limited thereto. The fillers 70, 71 may be introduced inside the metal covering member 20 after the joining process (process C). The fillers 70, 71 may be arranged inside the metal covering member 20 prior to the joining process (process C), and further, an additional filler may be supplied inside the metal covering member 20 after the joining process (process C).

EXAMPLES

In the following, some specific Examples of the invention will be illustrated, and the invention will be described in more detail.

Example 1

With reference to FIG. 1A, FIG. 1B, FIG. 2, and FIG. 3, a composite superconductor 10 having a rectangular cross-section will be described. First, a superconductor 30 will be described. An $Nb_3Sn$ superconducting element wire having a diameter of 1 mm, a copper ratio of 1, a bronze ratio of 2.3, a filament diameter of 3.7 μm, and a twist pitch of 25 mm before a reaction heat treatment was produced by a bronze process. The surface of the element wire was Cr plated, and then, the 18 Cr plated $Nb_3Sn$ superconducting element wires were twisted and subjected to a rectangular molding. Thereafter, an $Nb_3Sn$ reaction heat treatment at 650° C.×96 hr was performed under an argon atmosphere to produce a reaction heat treated $Nb_3Sn$ rectangular molded twisted wire with a size of width 9.2 mm×thickness 1.8 mm and a twist pitch of 94 mm.

Next, a metal covering member 12 will be described. The metal covering member 12 was configured by a channel member 11 having a rectangle cross-section, which had been prepared by forming a wide groove 15 with a size of width 11 mm×depth 3.5 mm in the center of an aluminum A6061-T6 alloy with a size of width 17 mm×thickness 5 mm, and a fitting member 13 made of an aluminum A6061-T6 alloy with a size of width 11 mm×thickness 1.5 mm which was fitted into the wide groove 15.

Next, a reinforcing member 40 will be described. An SUS304 rectangular wire having a thickness of 0.75 mm and a width of 2 mm was arranged as the reinforcing member 40 on each of the both end portions in the width direction of the superconductor 30 composed of a superconducting twisted wire. Here, the width of the wide groove 15 equals to 9.5 mm which was the value obtained by removing the widths (0.75 mm×2) of the arranged reinforcing members 40, 40.

Here, the superconductor 30, the channel member 11, the fitting member 13, and the reinforcing member 40 configuring the composite superconductor 10 were arranged in the following manner to form a structure prior to joining. The reinforcing member 40 was arranged at both end portions in the width direction of the wide groove 15 formed on the channel member 11, the superconductor 30 was arranged between the reinforcing members 40, and the fitting member 13 was arranged in a vacant space in the height (thickness) direction of the wide groove 15 accommodating the reinforcing member 40 and the superconductor 30.

Next, FSW joining will be described. After inserting the superconductor 30 composed of the above-mentioned reaction heat treated $Nb_3Sn$ rectangular molded twisted wire into the groove 15 with a size of net width 9.5 mm×depth 3.5 mm, the reinforcing member 4 was arranged at both sides of the molded twisted wire, the fitting member 13 with a size of width 11 mm×thickness 1.5 mm was fitted into the groove 15, and then, two seams 51 of the aluminum channel member 11 and the fitting member 13 were each joined by FSW.

In FSW joining, joining was performed by pressing an FSW steel rotary tool 60 having on the tip a pin (not illustrated) against the fitting member 13 such that a surface pressure was indirectly applied approximately vertically (P1 direction in the Figure) with respect to the wide face of the superconductor 30 composed of a reaction heat treated $Nb_3Sn$ rectangular molded twisted wire. Conditions of rotation speed of 2500 rpm, joining speed of 500 mm/min., and horizontal movement of tool 60 were employed. In such a manner, the composite superconductor 10 with a size of width 17 mm×thickness 5 mm pertaining to Example 1 was obtained.

Here, the superconductor 30 and the reinforcing member 40 in the metal covering member 12 were arranged in consideration of the applying direction of a stress (surface pressure) during joining. The reinforcing member 40 was positioned on the line extended from the seam 51 (to-be-joined portion) in P1 direction of an applied stress, and the superconductor 30 was not positioned on the extended line in the P1 direction. By employing such an arrangement, the reinforcing member 40 retains the stress in the P1 direction applied to the fitting member 13 at both end portions in the width direction of the fitting member 13 and inhibits dipping of the fitting member 13 into a portion accommodating the superconductor 30.

Example 2

With reference to FIG. 3, FIG. 4A, FIG. 4B, and FIG. 5, another Example of a composite superconductor having a rectangular cross-section will be described.

The same superconductor 30 as the above-mentioned Example 1 was used.

The metal covering member 20 was configured by the grooved member 21 and the grooved member 22.

The superconductor 30 was arranged in a major groove 23 of the grooved member 21 having a rectangular cross-section (FIG. 3, process A). One end portion of the reinforcing member 40 having a thickness of 0.5 mm and a width of 2.5 mm was arranged at both sides of the superconductor 30 and in a minor groove 25 of the grooved member 21 (FIG. 3, process B). Tape shaped fillers 70, 71 composed of indium having a thickness of 0.2 mm and a width of 8.5 mm were arranged on the upper side and the bottom side of the superconductor 30 (FIG. 3, process D). Then, a major groove 24 of the grooved member 22 was fitted thereto, and another side end portion of the reinforcing member 40 having a thickness of 0.5 mm and a width of 2.5 mm was arranged in a minor groove 26 of the grooved member 22, and two seams 52 on both sides were joined by FSW (FIG. 3, process C).

For the grooved members 21, 22, an A6061-T6 alloy was employed. For the reinforcing member 40, SUS304 was employed. Joining was performed by FSW. In FSW joining, joining was performed by pressing an FSW steel rotary tool 60 having on the tip a pin (not illustrated) against two seams 52 on the lateral side of the fitting members 21, 22 such that a surface pressure was applied in an approximately horizontal direction with respect to the wide face of a reaction heat treated $Nb_3Sn$ rectangular molded twisted wire. Conditions of rotation speed of 2500 rpm, joining speed of 500 mm/min., and horizontal movement of tool 60 were employed. In such a manner, the composite superconductor 10 with a size of width 12.5 mm×thickness 4 mm pertaining to Example 2 as illustrated in FIG. 5 was obtained.

Here, the superconductor 30 and the reinforcing member 40 in the metal covering member 12 were arranged in consideration of the applying direction of a stress (surface pressure) during joining. The reinforcing member 40 and the superconductor 30 were positioned on the line extended from the seam 52 (to-be-joined portion) in P2 direction of an applied stress, and the reinforcing member 40 was arranged in a minor groove 25 (reinforcing member fixing section) of the metal covering member 12. Since, by such an arrangement, the reinforcing member 40 receives a stress applied to the fitting members 21, 22 in the P2 direction immediately below the seam 52 (to-be-joined portion), and the stress which the reinforcing member 40 received was retained at both end portions of the reinforcing member 40 in the thickness direction in the minor groove 25 of the metal covering member 12, dipping of the fitting members 21, 22 into a portion accommodating the superconductor 30 is inhibited.

Example 3

With reference to FIG. 6A, FIG. 6B, FIG. 7, FIG. 8, FIG. 11A, and FIG. 11B, the present Example will be described.

Figure 6A:
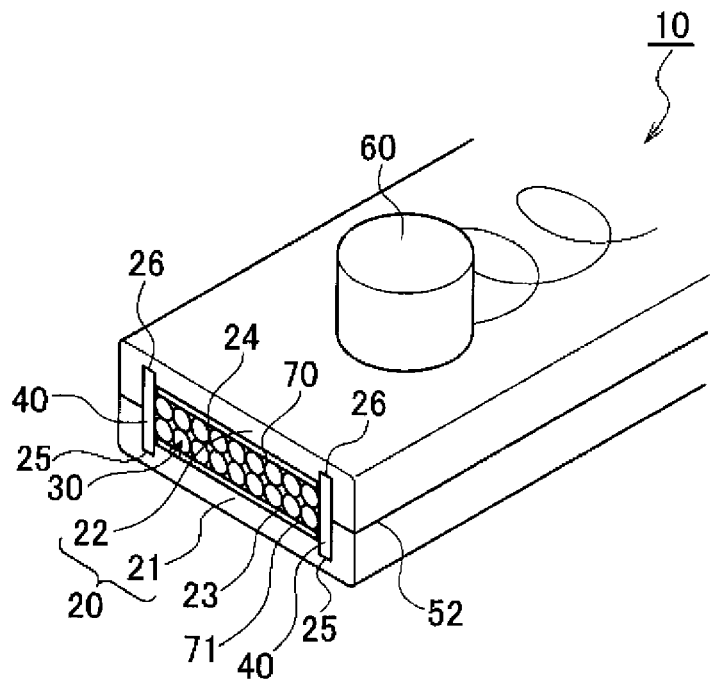
FIG. 6A illustrates a production process of a composite superconductor pertaining to Example 3 of the invention.
Figure 6B:
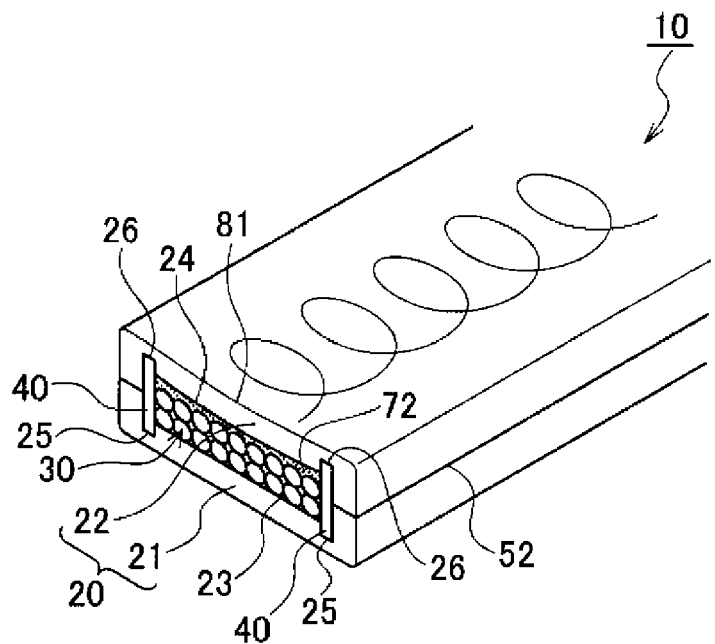
FIG. 6B illustrates a production process of a composite superconductor pertaining to Example 3 of the invention.
Figure 7:
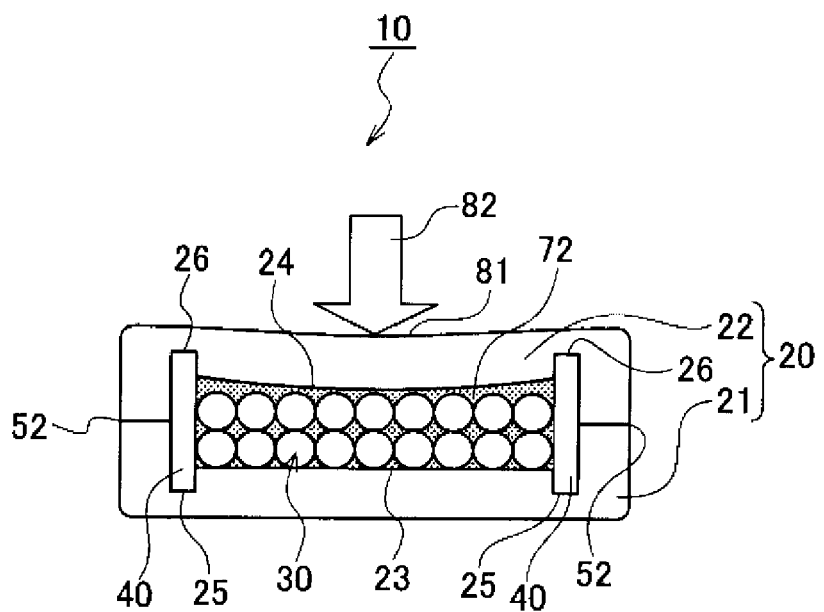
FIG. 7 illustrates a cross-section structure of a composite superconductor pertaining to Example 3 of the invention.
Figure 8:
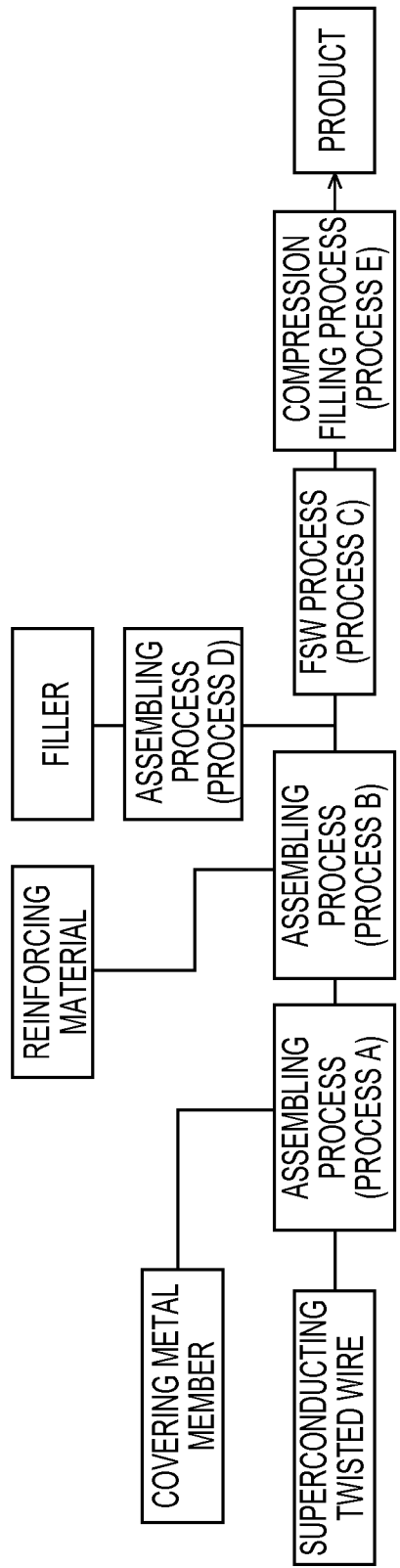
FIG. 8 illustrates a production process of a composite superconductor pertaining to Example 3 of the invention.

In order to further increase the performance of the composite superconductor 10 illustrated in Example 2, heat compression 82 (see FIG. 7) was performed for increasing the filling rate by applying the production method illustrated in FIG. 8 (FIG. 8, process E). For the heat compression method, a method in which an FSW rotary tool 60 without a pin was pressed whereby heating was performed by frictional heat and at the same time compression was performed was employed as illustrated in FIG. 6A and FIG. 6B. At this time, when decreasing a gap in the grooves 24, 23 by compression, in order not to damage the superconductor 30 due to buckling of an aluminum composite member of the grooved member 22 configuring the metal covering member 20, the compression dimension and the compressive force were adjusted. In order to obtain a temperature higher than the melting point of the filler 70, 71 but lower than the softening temperature of the aluminum composite member configuring the metal covering member 20, the temperature of the frictional heat was adjusted. In this case, fillers 70, 71 melted by heating, and a space between the metal covering member 20 and the superconductor 30 was filled with filler 72. In such a manner, the composite superconductor 10 with a size of width 12.5 mm×thickness 3.9 mm pertaining to Example 3 as illustrated in FIG. 7 was obtained.

Figure 11A:
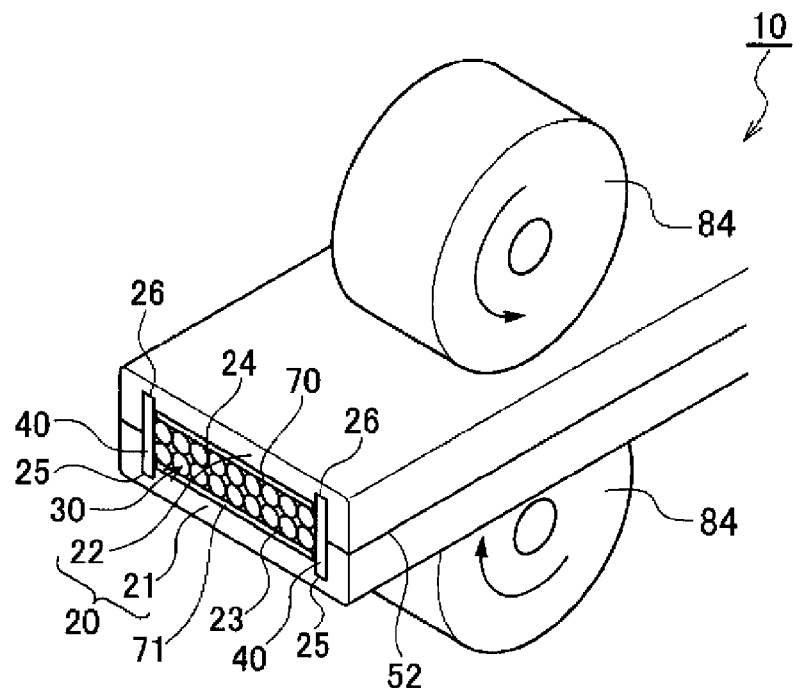
FIG. 11A illustrates another method of heat compression.
Figure 11B:
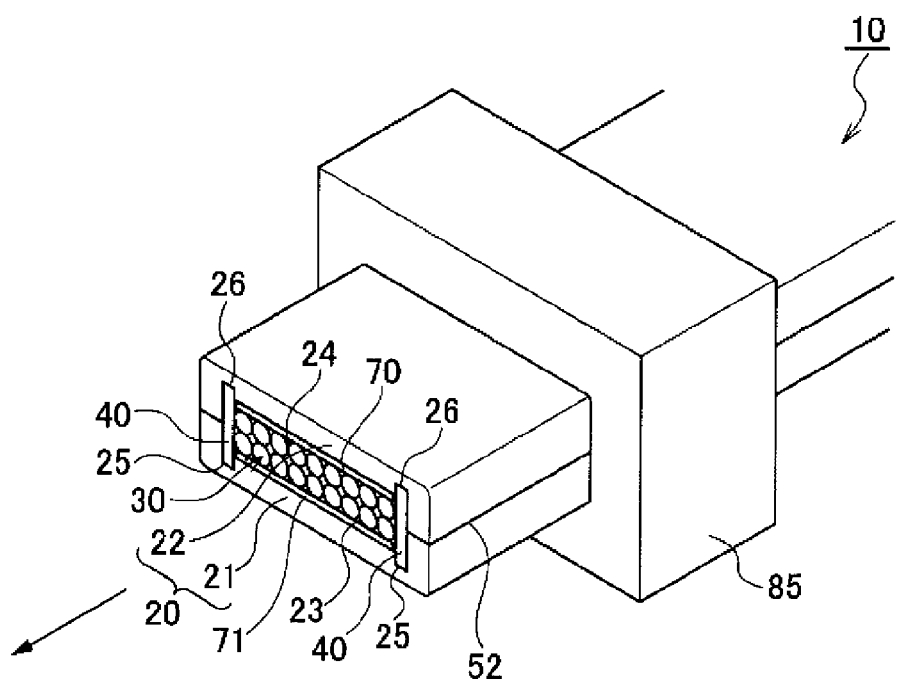
FIG. 11B illustrates another method of heat compression.

For the heat compression 82, other than a method by FSW rotary tool 60, a method by heat compression roller 84 illustrated in FIG. 11A, a method using a heated die for compression 85 illustrated in FIG. 11B can also be used similarly to increase the performance. In any of these heat compression, in order not to damage the superconductor 30 due to buckling of the aluminum composite member of the grooved member 22, the compression dimension and the compressive force were adjusted. In order to obtain a temperature higher than the melting point of the filler 70 but lower than the softening temperature of the aluminum composite member configuring the metal covering member 20, the heating temperature was adjusted. Although, for the heat compression method, an optimal method should be employed depending on the peripheral shape or internal structure of the composite superconductor, a plurality of methods may be combined. When there is a rough portion such as burr or flaw generated on the surface of metal covering member during FSW execution, it is desirable that the heat compression is performed after removing the rough portion from the viewpoint of not damaging the inside superconductor. Although it is important that heating and compression are performed simultaneously by bringing a tool and the composite superconductor 10 as illustrated in FIG. 6, FIG. 11A, and FIG. 11B into contact, preheating prior to the heat compression execution or cooling after the execution can be performed for a further strict temperature control.

Example 4

Figure 9:
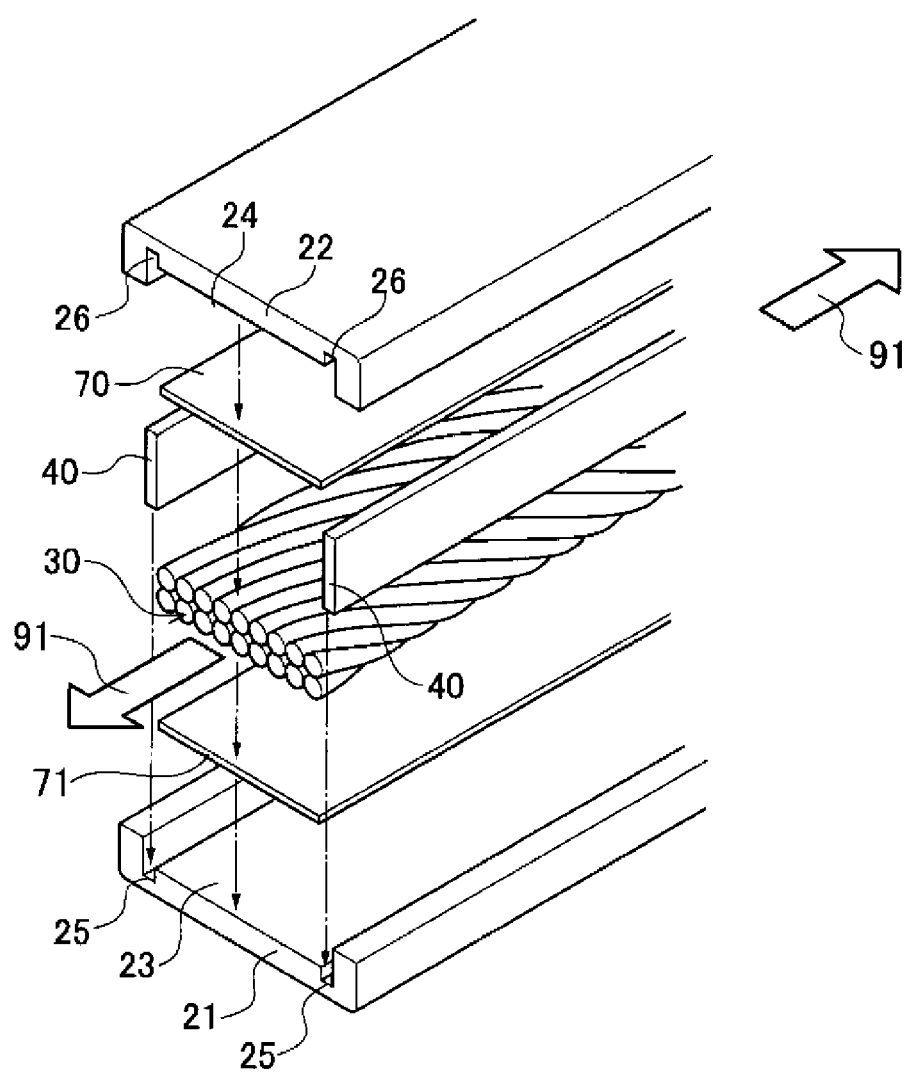
FIG. 9 illustrates a production process of a composite superconductor pertaining to Example 4 of the invention.

In order to further increase the performance of the composite superconductor 10 illustrated in Example 3, by applying the production methods illustrated in FIG. 9, FIG. 10, in a state in which 0.02% tensile strain was applied to (see arrow sign 91 in FIG. 9) the superconductor 30 composed of a superconducting twisted wire, the reinforcing members 40 were assembled (FIG. 10, process B), the fillers 70, 71 were assembled (FIG. 10, process D), and the joint portion was joined by FSW (FIG. 10, process C). Thereafter, compression filling (FIG. 10, process E) was executed. For the heat compression method, a method in which an FSW rotary tool without a pin was pressed whereby heating was performed by frictional heat and at the same time compression was performed was employed in the same manner as in Example 3. The thus obtained composite superconductor 10 pertaining to Example 4 had a size of width 12.5 mm×thickness 3.9 mm, and the cross-section structure was similar to Example 3 illustrated in FIG. 7.

Example 5

With reference to FIGS. 14A to 14E, a composite superconductor 10 to which a superconducting molded twisted wire formed by using a compression-molded superconducting wire is applied as a superconductor 30 will be described.

Figure 14A:
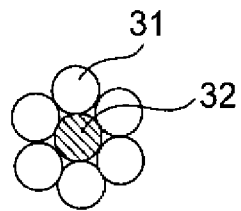
FIG. 14A illustrates a production process of a composite superconductor pertaining to Example 5 of the invention.
Figure 14B:
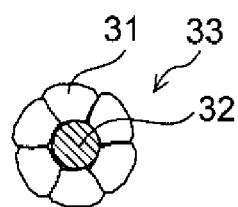
FIG. 14B illustrates a production process of a composite superconductor pertaining to Example 5 of the invention.
Figure 14C:
FIG. 14C illustrates a production process of a composite superconductor pertaining to Example 5 of the invention.
Figure 14D:
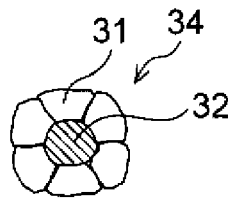
FIG. 14D illustrates a production process of a composite superconductor pertaining to Example 5 of the invention.
Figure 14E:
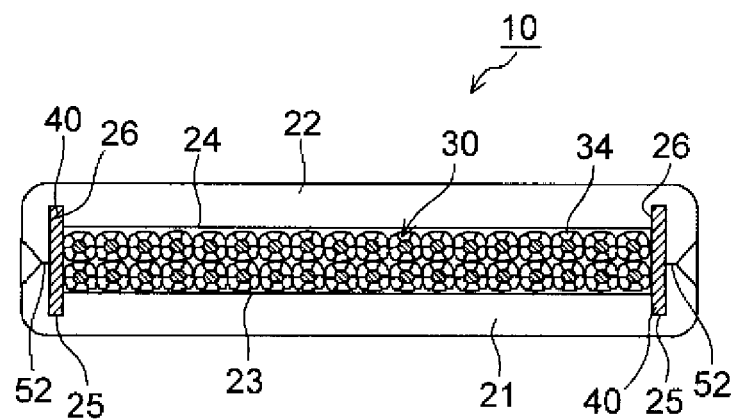
FIG. 14E illustrates a production process of a composite superconductor pertaining to Example 5 of the invention.

A composite superconductor in which a double molded rectangular twisted wire (superconducting molded twisted wire) including a round compressed conductor as a primary twisted wire will be described. As illustrated in FIG. 14A, an $Nb_3Sn$ superconducting element wire before a reaction heat treatment having a diameter of 1.7 mm, a copper ratio of 1, a bronze ratio of 2.5, a filament diameter of 2.5 µm, and a twist pitch of 30 mm was produced by a bronze process, and the surface of the element wire was Cr plated, and then, the six Cr plated $Nb_3Sn$ superconducting element wires 31 were twisted around the copper wire 32 having a diameter of 1.7 mm to obtain a primary twisted wire. Thereafter, as illustrated in FIG. 14B, compression processing was performed such that the cross-section became a circle, and a compression-molded superconducting wire 33 which was a round compressed conductor of a primary twisted wire having a diameter of 4.8 mm was obtained. Thereafter, as illustrated in FIG. 14C, the 36 compression-molded superconducting wires 33 were twisted and molded into a rectangular shape to produce a double molded twisted wire, and an $Nb_3Sn$ reaction heat treatment at 650° C.×96 hr was performed in an argon atmosphere to produce a superconducting molded twisted wire (superconductor 30) configured by a reaction heat treated $Nb_3Sn$ superconducting wire having a width of 87 mm and a thickness of 9.2 mm. FIG. 14D illustrates one rectangular molded superconducting wire 34 of 36 superconducting molded twisted wires 30 molded into a rectangular shape.

Next, a metal covering member will be described. The aluminum channel members 21, 22 having a rectangular cross-section in each of which, on the center of an aluminum A6061-T6 alloy with a size of width 100 mm×height 12.5 mm, wide major groove 23 or 24 with a size of width 89 mm×depth 5 mm was formed, and on both sides thereof, narrow minor grooves 25, 26 with a size of width 1.1 mm×depth 2.5 mm were formed were produced. A reinforcing material 40 composed of a SUS304 rectangular wire having a thickness of 1 mm and a width of 14 mm which functioned as a backing member in FSW execution was produced.

The double molded rectangular twisted wire 30 was installed on the major grooves 23, 24 of the grooved aluminum channel member 21, 22, and a reinforcing material 40 was arranged on each of the minor grooves 25, 26 on both sides thereof. Two seams 52 of the aluminum channel members 21, 22 were each joined by FSW. FSW joining conditions were similar to the execution conditions in Example 2.

Comparative Example

Figure 12A:
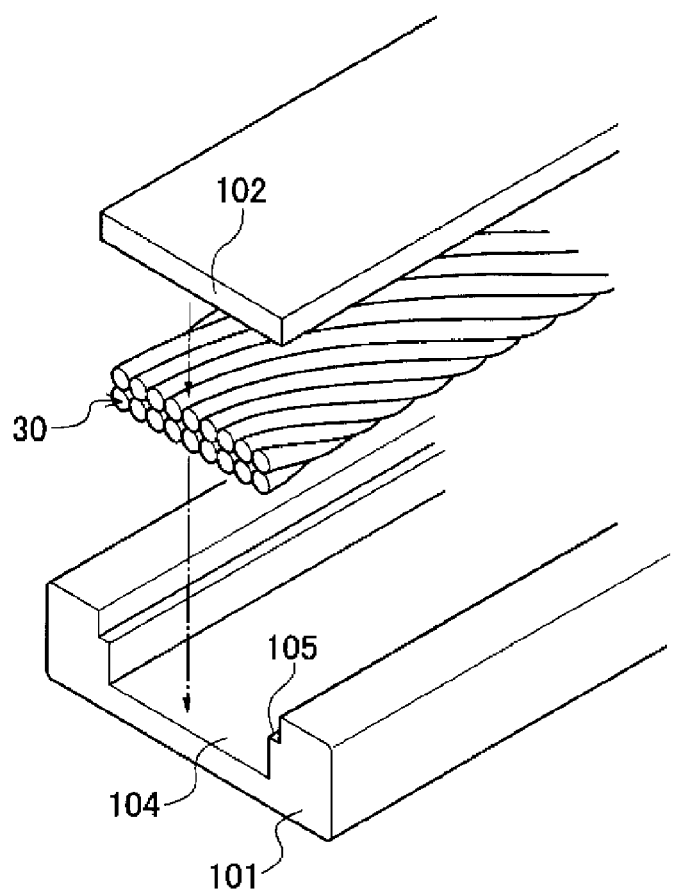
FIG. 12A illustrates a production process of a composite superconductor pertaining to Comparative Example.
Figure 12B:
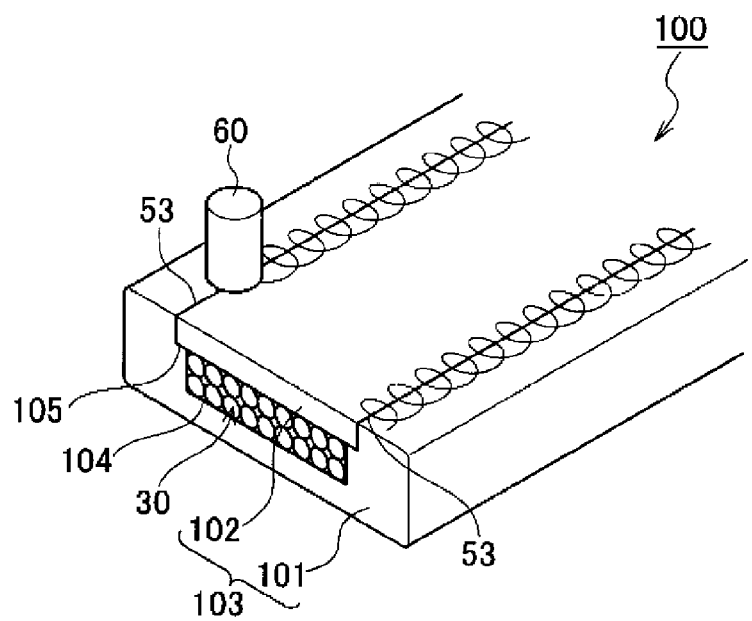
FIG. 12B illustrates a production process of a composite superconductor pertaining to Comparative Example.
Figure 13:
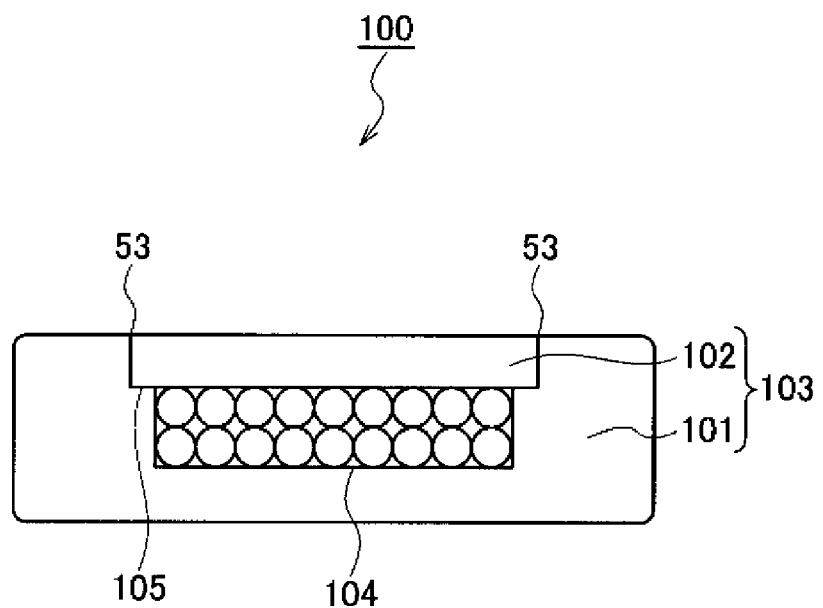
FIG. 13 illustrates a cross-section structure of a composite superconductor pertaining to Comparative Example.

With reference to FIG. 12A, FIG. 12B, FIG. 13, a composite superconductor 100 of Comparative Example will be described. An aluminum channel member (grooved member 101) having a rectangular cross-section in which two-step grooving of wide groove 105 with a size of width 11 mm×depth 1.5 mm and a narrow groove 104 with a size of width 9.5 mm×depth 2 mm was performed on the center of an aluminum alloy 6061-T6 with a size of width 17 mm×thickness 5 mm, and a fitting member 102 composed of an aluminum alloy 6061-T6 that was fitted into a wide groove with a size of width 11 mm×depth 1.5 mm were produced. The grooved member 101 and the fitting member 102 configured the metal covering member 103.

After inserting a reaction heat treated $Nb_3Sn$ rectangular molded twisted wire (the same superconductor 30 as that used in Example 1) into the narrow groove 104 with a size of width 9.5 mm×depth 2 mm, the fitting member 102 was fitted into the wide groove 105 with a size of width 11 mm×depth 1.5 mm, and two seams 53 of the channel member 101 and the fitting member 102 were each joined by FSW. During joining, the FSW rotary tool 60 was pressed against the fitting member 102 such that a surface pressure is applied approximately perpendicular to the wide face of the reaction heat treated $Nb_3Sn$ rectangular molded twisted wire to obtain a composite superconductor 100 with a size of width 17 mm×thickness 5 mm. FSW joining conditions were similar to those in Example 1.

For the obtained composite superconductor 100, evaluations of the following items were performed. For each item, the following measurement was performed and an evaluation criteria was provided.

(1) Critical Current Density Per Overall Cross-Sectional Area of Conductor

It is calculated as Ic (critical current, defined as a current when an electric field of 1 µV/cm is generated at 8T, 4.2 K)/cross-sectional area of composite superconductor.

A: 200 A/mm² or higher (evaluation points: 3)
B: 150 A/mm² or higher but lower than 200 A/mm² (evaluation points: 2)
C: 100 A/mm² or higher but lower than 150 A/mm² (evaluation points: 1)
D: lower than 100 A/mm² (evaluation points: 0)

(2) Filling Rate

It is defined as the volume ratio of filling member configured by a superconductor 30, a reinforcing member 40, a filler 72, and the like with respect to the volume of the inside of the metal covering member 20 or 103.

A: 95% or higher (evaluation points: 3)
B: 88% or higher but lower than 95% (evaluation points: 2)
C: 78% or higher but lower than 88% (evaluation points: 1)
D: lower than 78% (evaluation points: 0)

(3) Comprehensive Evaluation

The sum of evaluation points of critical current density per overall cross-sectional area of conductor and evaluation points of filling rate
A: Evaluation points: 5 or higher
B: Evaluation points: 3 or 4
C: Evaluation points: 1 or 2
D: Evaluation points: 0

The comparison results of the performances of the composite superconductors of Examples 1 to 4 according to the invention and Comparative Example are listed in Table 1.

In the composite superconductor of Example 1, decrease in the critical current was not observed, while in the composite superconductor of Comparative Example using the conventional art, the critical current decreased by about 10%.

In the composite superconductor in Example 2, decrease in the critical current was hardly observed in the same manner as in Example 1, and 9 kA or higher of a current-carrying under an external magnetic field of 8 T was possible. The critical current density per overall cross-sectional area of conductor was about 1.7 times that of the composite superconductor in Example 1. This is because, when the same superconductor is used and as long as there is no deterioration in the characteristic thereof, the smaller the combined metal covering member is, the larger the current density per overall cross-sectional area of the composite superconductor becomes. The reason why the combined metal covering member was able to be made small in Example 2 is thought to be due to an effect of the invention.

By comparing a composite superconductor of Example 3 with Example 2, it was confirmed that filling rate and conductor current density were improved in Example 3. This is thought to be because the joining properties between the metal covering member and the superconducting twisted wire were improved since heat compression was performed. It is thought that since it was easy to adjust the compressive force due to the presence of a reinforcing material, deterioration of the superconducting characteristic due to heat compression did not occur.

The composite superconductor of Example 4 was the best in the comprehensive evaluation. This is thought to be because, in the effect of Example 3, due to the effect of tensile strain applied during execution, compression strain applied to $Nb_3Sn$ superconducting wire was mitigated even during cooling, and improvement of the current-carrying characteristic was observed.

As a result, the composite superconductor of the invention can be evaluated as more excellent than conventional art in a comprehensive way since the filling rate of superconductive portion is high and the conductor critical current density is high.

TABLE 1

| | Structure of $Nb_3Sn$ superconductor | Metal covering member | Filling rate | Critical current density per overall cross-sectional area of conductor | Comprehensive evaluation |
|---|---|---|---|---|---|
| Example 1 | 18-molded twisted wire | A6061-T6 | C | C | C |
| Example 2 | 18-molded twisted wire | A6061-T6 | B | B | B |
| Example 3 | 18-molded twisted wire | A6061-T6 | A | B | A |
| Example 4 | 18-molded twisted wire | A6061-T6 | A | A | A |
| Comparative Example | 18-molded twisted wire | A6061-T6 | D | D | D |

On the other hand, the composite superconductor of Example 5 is a high capacity conductor having a current-carrying capacity on the design in the order of 100 kA, which is different from the superconductor used in Examples 1 to 4. Based on the result of a current-carrying test conducted by taking out one element wire (Cr plated $Nb_3Sn$ superconducting element wire 31) from a compression molded primary twisted wire (compression-molded superconducting wire 33) in view of the circumstances of the current-carrying capacity of the testing device, the element wire which was twisted back after compression processing maintained the performance of the element wire before compression processing. Since, in comparison with a superconducting molded twisted wire obtained by not subjecting a primary twisted wire to a compression processing and subjecting only a secondary twisted wire to compression molding processing, the filling rate increased by about 5%, this mode is thought to be effective for increasing the capacity and the current density of the composite superconductor.

As above, according to the embodiment of the invention, a metal covering member such as aluminum and a superconductor composed of a compound superconductive material ($Nb_3Sn$, $Nb_3Al$, Bi superconductive material, Y superconductive material, $MgB_2$ superconductive material) or the like, which is vulnerable to mechanical strain, other than an alloy superconductive material (NbTi or the like) can be combined, whereby a practical composite superconductor whose current-carrying characteristic hardly falls below the current-carrying characteristic thereof before combining can be provided.

The disclosure of Japanese Patent Application No. 2011-194403 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

Various typical embodiments have been illustrated and described, but the invention is not limited thereto. Accordingly, the scope of the invention is only restricted by the following Claims.

The invention claimed is:

1. A method for producing a composite superconductor, comprising:
    a structure forming process of forming a structure including a metal covering member including at least one to-be-joined portion, a superconductor arranged inside the metal covering member, and a reinforcing member arranged between the superconductor and the at least one to-be-joined portion; and
    a joining process of joining thereafter the at least one to-be-joined portion,
    wherein the structure forming process is a process of forming the structure such that the reinforcing member and the superconductor exist on a line extended from the to-be-joined portion in a direction in which a stress is applied in the joining process, and such that both end portions of the reinforcing member are positioned at reinforcing member fixing sections formed on the metal covering member.

2. The method for producing a composite superconductor according to claim 1, wherein
    the structure forming process is a process of forming a structure including the metal covering member including at least one to-be-joined portion, the superconductor arranged inside the metal covering member, the reinforcing member arranged between the superconductor and the at least one to-be-joined portion, and a filler arranged inside the metal covering member, and
    the method further comprises, after the joining process, a process of heating the structure in which the joining has been performed and applying pressure to the metal covering member from outside.

3. The method for producing a composite superconductor according to claim 2, wherein a releasing hole for releasing at least one of a surplus of the filler or a gas inside the metal covering member is formed in the metal covering member.

4. The method for producing a composite superconductor according to claim 1, wherein the joining of the at least one to-be-joined portion is performed by a friction stir welding method.

5. The method for producing a composite superconductor according to claim 4, wherein the metal covering member is pure aluminum or an aluminum alloy, and the superconductor is a compound superconductor.

6. The method for producing a composite superconductor according to claim 5, wherein the joining process is performed in a state in which tensile strain is applied to the superconductor.

7. The method for producing a composite superconductor according to claim 1, wherein the superconductor is a superconducting molded twisted wire that has been obtained by twisting and molding surface-plated superconducting element wires, and a plating on a surface of the superconducting molded twisted wire has been partially removed.

8. The method for producing a composite superconductor according to claim 2, wherein an inner surface of the metal covering member has been plated, and the superconductor is in contact with the metal covering member via a plated portion.

9. A composite superconductor comprising:
    a superconductor;
    a metal covering member which surrounds an outer periphery of the superconductor and has at least one joint portion; and
    a reinforcing member arranged between the joint portion and the superconductor,
    wherein the reinforcing member has a 0.2% proof stress that is larger than that of the metal covering member.

10. The composite superconductor according to claim 9, wherein a reinforcing member fixing section for fixing the reinforcing member is formed on the metal covering member, and the reinforcing member is fixed on the reinforcing member fixing section.

11. The composite superconductor according to claim 9, wherein a filler exists between the metal covering member and the superconductor.

12. The composite superconductor according to claim 9, wherein the superconductor is a superconducting molded twisted wire formed by twisting a plurality of superconducting wires.

13. The composite superconductor according to claim 12, wherein the superconducting wire is a compression-molded superconducting wire obtained by compression-molding a plurality of superconducting element wires arranged on an outer periphery of a core wire.

* * * * *